US 8,020,010 B2

(12) United States Patent
Pastorello et al.

(10) Patent No.: US 8,020,010 B2
(45) Date of Patent: Sep. 13, 2011

(54) MEMORY POWER CONTROLLER

(75) Inventors: Douglas F. Pastorello, Hudson, NH (US); Patrick De Bakker, Hollis, NH (US); Louis J. Nervegna, Andover, MA (US)

(73) Assignee: Silicon Laboratories Inc., Austin, TX (US)

( * ) Notice: Subject to any disclaimer, the term of this patent is extended or adjusted under 35 U.S.C. 154(b) by 706 days.

(21) Appl. No.: 12/144,803

(22) Filed: Jun. 24, 2008

(65) Prior Publication Data
US 2009/0319814 A1    Dec. 24, 2009

(51) Int. Cl.
*G06F 9/30*    (2006.01)
*G06F 9/38*    (2006.01)

(52) U.S. Cl. ........ 713/300; 713/310; 713/320; 713/321; 713/322; 713/323; 713/324; 713/330; 713/340; 327/142; 327/143

(58) Field of Classification Search .................. 713/300, 713/310, 320–324, 330, 340; 327/142, 143
See application file for complete search history.

(56) References Cited

U.S. PATENT DOCUMENTS

| 5,699,309 | A | * | 12/1997 | Cronin et al. ................. 365/203 |
| 5,892,729 | A | * | 4/1999 | Holder, Jr. ................. 365/233.1 |
| 5,986,969 | A | * | 11/1999 | Holder, Jr. ................. 365/233.1 |
| 7,346,760 | B2 | * | 3/2008 | Yoshida et al. ................ 712/213 |
| 7,672,191 | B2 | * | 3/2010 | Jang ........................ 365/233.12 |
| 2004/0202263 | A1 | * | 10/2004 | Choi .............................. 375/354 |
| 2005/0283582 | A1 | * | 12/2005 | Aakjer ......................... 711/167 |

* cited by examiner

*Primary Examiner* — Abdelmoniem Elamin
(74) *Attorney, Agent, or Firm* — Polansky & Associates, P.L.L.C.

(57) ABSTRACT

A memory power controller comprises a clock generation circuitry for generating a first clock signal and a second clock signal responsive to a source clock and a determination that the source clock has a period greater than a predetermined value. The first clock is generated responsive to a determination that the source clock has a period greater than the predetermined value and the second clock is generated responsive to the determination that the source clock has a period less than the predetermined value. Memory time-out circuitry generates a memory enable/disable signal to control operation of an associated memory responsive to the clock signal and the determination that the source clock has a period greater than the predetermined value. The memory time-out circuitry further synchronizes the memory enable/disable signal with the source clock.

23 Claims, 7 Drawing Sheets

MEMORY POWER CONTROLLER

TECHNICAL FIELD

The present invention relates to memory power controller circuitry, and more particularly, to a system for controlling one time programmable memories using multiple clock signals generated from a single oscillator signal.

BACKGROUND

Memory components such as one time programmable memories, registers, ROM, RAM, flash memory, etc., are used within a wide variety of digital circuitries. When these memories are used within low power applications, various types of problems often arise. One problem involves the large static current required by memories. The static current varies depending upon the output word maintained on the outputs of the memories. In this situation, the static currents used by the memory can vary anywhere from 1 milliamp to 1.5 milliamps. Due to the large static currents, the memories require higher device powers than are desired, particularly when the system clock associated with the memory slows toward 0 Hz.

One solution to this problem has been to turn off the memory devices to save power when they are in a non active state. However, when a memory is turned off, additional problems arise due to the long time the memory devices take to power up relative to the system clock. Many memories such as one time programmable memories may have a turn on time of approximately 300 nanoseconds. Thus, there is a need for an improved solution to memory power control within low power devices that limits the power usage of the memory when not in use, yet sufficiently addresses the long turn on times associated with the memories.

SUMMARY

The present invention, as disclosed and described herein, in one aspect thereof, comprises a memory power controller including clock generation circuitry for generating a first clock signal and a second clock signal responsive to a source clock and a determination that the source clock has a period greater than a predetermined value. The first clock is generated responsive to the determination that the source clock has a period greater than the predetermined value. The second clock is generated responsive to the determination that the source clock has a period less than the predetermined value. Memory time-out circuitry generates a memory enable/disable signal to control operation of the associated memory responsive to the source clock and the determination that the source clock has the period greater than the predetermined value. The memory time-out circuitry further synchronizes the memory enable/disable signal with the source clock.

BRIEF DESCRIPTION OF THE DRAWINGS

For a more complete understanding, reference is now made to the following description taken in conjunction with the accompanying Drawings in which.

DETAILED DESCRIPTION

Figure 1:
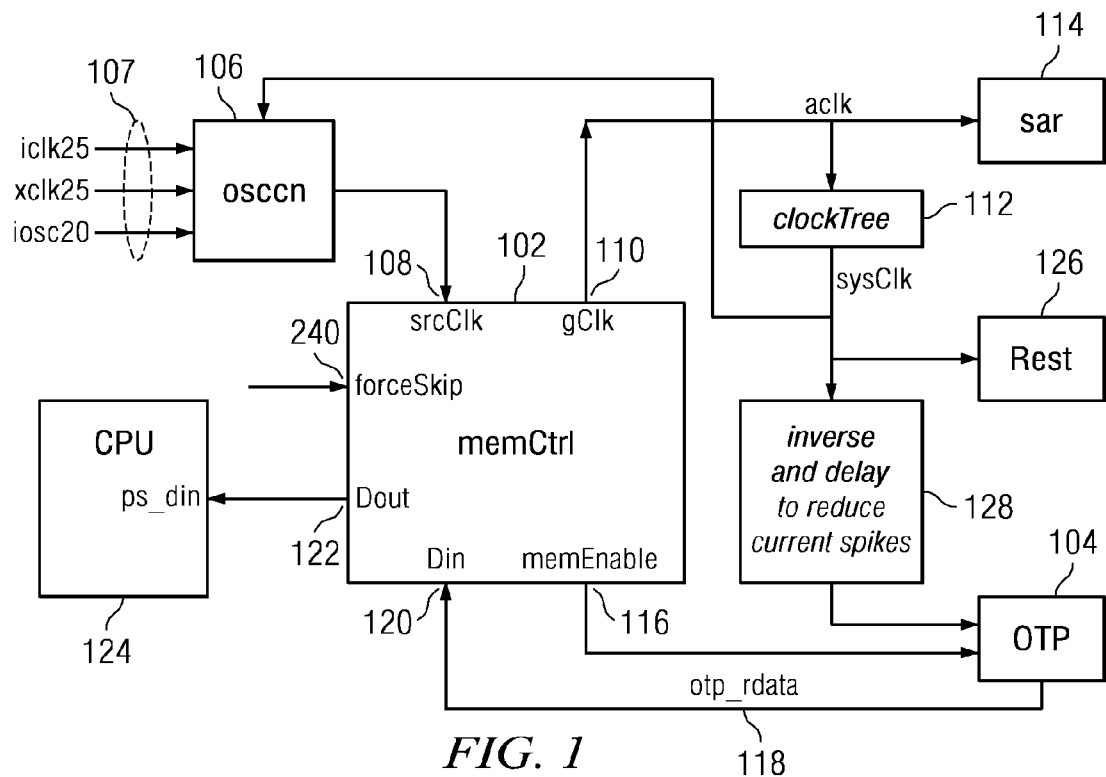
FIG. 1 is a block diagram of a digital system including an OTP memory having the memory power controller of the present disclosure.

Referring now to the drawings, wherein like reference numbers are used herein to designate like elements throughout, the various views and embodiments of a memory power controller are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a memory power controller 102 used within a digital circuitry including a one time programmable memory 104 and an oscillator source 106. The memory power controller 102 enables power control of an associated OTP memory 104. The oscillator circuit 106 generates a source clock (SRCCLK) that is applied to the memory power controller 102 at its clock input 108. The oscillator circuit 106 generates the source clock signal for the circuit responsive to various control signals provided via inputs 107. The output of the memory power controller 102 is provided as a gated clock signal (GCLK) via an output 110. The gated clock signal provided from the memory power controller 102 is applied to a clock tree 112 and a SAR register 114. The memory power controller 102 additionally provides a memory enable signal via output 116 to the OTP memory 104. Using the memory enable signal, the memory power controller 102 may turn on and off the OTP memory 104. The OTP memory 104 has data contained therein read via line 118 through the $D_{IN}$ input 120 of the power memory controller 102. The read data is output via the $D_{OUT}$ output 122 of the power memory controller 102 to a central processing unit 124. The "Din" (120) and "Dout" (122) ports of the controller add an adjustable pipe-line delay in the memory data path to ensure that the CPU 124 gets the proper data in all controller modes.

Responsive to the gated clock signal, the clock tree 112 generates a system clock that is provided to rest circuitry 126 and inverse and delay circuitry 128. The inverse and delay circuitry 128 is used to reduce current spikes within the OTP memory 104. The system clock is additionally provided back to the oscillator circuit 106. Other types of digital circuits using memories are also possible.

The general goal of the memory power controller 102 is to turn off the OTP memory 104 when it can save overall system power. The memory power controller 102 does this by switching between slow and fast clock modes as will be described herein below. Power can be saved if the system clock period is long enough to allow the OTP memory 104 enough time to turn back on, after being turned off. When the system is running with a slow clock, the system can not require multiple clock cycles to turn on the memory. This would be a major performance impact, and reduce the power savings because the memory would have to be turned on for a complete clock cycle. When the controller 102 transitions from a slow clock operating mode, to a fast clock mode, the controller 102 needs to ensure that the rest of the system is not clocked until the OTP 104 memory has had time to turn on. This is done by skipping a number (20) of input clocks. An alternative is to skip clocks for a fixed amount of time (e.g., 300 nS), but the present application prefers a fixed number of clock cycles.

The OTP memories 104 can be turned off for reasons other than a slow system clock (e.g., IDLE mode). In these cases, clock skipping is also needed to ensure the OTP memories 104 have enough time to turn on. The "forceSkip" inputs of the memory power controller 102 enable this feature.

Figure 2:
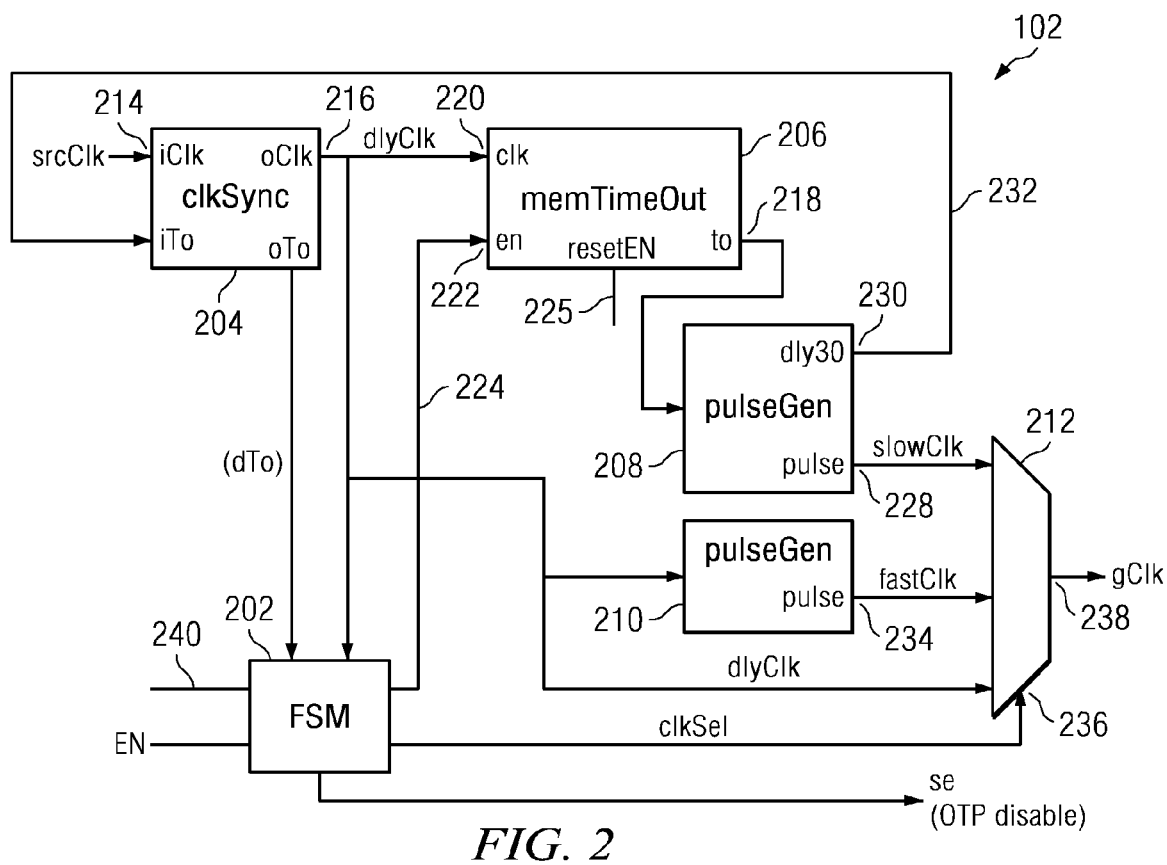
FIG. 2 is a functional block diagram of the memory power controller.

Referring now to FIG. 2, there is provided a functional block diagram of the memory power controller 102. The memory power controller 102 consists of a finite state machine 202, a time-out synchronization circuit 204, a memory time-out circuit 206 and a pair of pulse generation circuits 208, 210 having their outputs connected to a multiplexer circuit 212. The source clock signal received at the input of the memory power controller 102 is applied to the ICLK input 214 of the time-out synchronization circuit 204. The time-out synchronization circuit 204 generates a delay clock signal (DLYCLK) at output 216 that is used for clocking the remaining circuits within the memory power controller 102. The output delay clock is provided as a clock input to the memory time-out circuit 206 and is a clock input to the finite state machine 202. The memory time-out circuit 206 is used both to measure clock period of the delayed clock, and to delay the delayed (a.k.a. first) clock until the memory has powered-up. The time-out synchronization circuit 204 is also used to move the rising edge of the input time-out signal (iTo) received from pulse generation circuit 208 away from the rising edge of the delay clock signal being provided from output 216 to generate a delayed time out signal oTo. The timeout signal is generated by the memory timeout circuit 206 at output 218 responsive to a determination that the period for the delay clock signal provided to the input 220 of the memory time-out controller has exceeded a predetermined time period. The delay is determined using an RC (analog) delay to measure the received clock period. The memory timeout circuit 206 could also use an independent clock to measure the delay. Other embodiments may utilize a particular time period such as approximately 300 nanoseconds rather or a predetermined number of clock cycles.

Since the time-out signal generated at the output of the memory time-out circuit 206 is an asynchronous signal, it must be synchronized with the delay clock signal being provided to the finite state machine 202 and memory 104. However, the time-out signal cannot be synchronized with the delay clock signal using traditional retiming. The finite state machine 202 cannot afford a 2 clock cycle delay in responding to a timeout. The time-out signal cannot be delayed by the clock since there may be no clocks happening when the memory disable is needed. Thus, the time-out synchronization circuit 204 synchronizes the time-out signal to be no closer than 5 nS of the clock rising edge of the delay clock signal as will be more fully described herein below. The synchronized time-out signal oTo provided from the time-out synchronization circuit 204 in addition to being provided to the finite state machine 202, may be used by the finite state machine 202 to generate a one time programmable memory disable signal (se) that disables the one time programmable memory 104 when the time-out signal from the memory time-out circuit 206 goes high.

The memory time-out circuit 206 is responsible for comparing the period of the delay clock signal received at its clock input 220 with a predetermined time period. Thus, the memory time-out circuit 206 clears the time-out delay signal (to) on every rising edge of the input clock. If this period of the received delay clock signal exceeds a predetermined time period, the time-out signal provided at output 218 will go high. The memory time-out circuit 206 is enabled and disabled via an enable input 222 provided from the FSM circuit 202. The enable ("en") input is used to enable the timer. When disabled, the rising edge of the input clock no longer starts a time-out sequence, and the output is forced inactive. This happens when the memory power controller 102 is not being used (BYPASS state). The reset-enable ("resetEn") 225 input is used to enable the triggering. When disabled, the rising edge of the input clock no longer re-starts a time-out sequence on every rising edge. Instead, the memory time-out circuit 206 forces the current time-out to complete before a new one can start. This provides the ability to use the memory time-out circuit 206 for both frequency detection, and clock delay.

The time-out signal is applied from the memory time-out circuit 206 to a pulse generation circuit 208. The memories require a full clock cycle, once powered on, to produce valid data. In order to ensure a full cycle, where needed, pulse generators 208 and 234 are used to create the proper clock edges, and return the resulting clock to an inactive state, independently (somewhat) of the source clock. The pulse generation circuit 208 generates a slow clock signal at pulse output 228 responsive to the time-out signal. The pulse generation circuit 208 also generates a delayed time-out signal at output 230 to the time-out synchronization circuit 204 on line 232 responsive to the time-out signal from the memory time-out circuit 206. A second pulse generation circuit 210 generates the fast clock signal at output 234 responsive to the input delay clock signal from the time-out synchronization circuit 204.

A multiplexer 212 is connected to receive the slow clock signal from pulse generation circuit 208, the fast clock signal from pulse generation circuit 210 and the delay clock signal from the clock synchronization circuit 204. The multiplexer 212 selects between these three clock signals responsive to a clock select signal applied from the finite state machine 202 via input 236. The multiplexer 212 outputs the selected clock signal as the gated clock output (GCLK) at output 238 which comprises the clock output of the power memory controller 102.

The finite state machine 202 generates the clock select signal to the multiplexer 236 responsive to the synchronized time-out signal provided from the time-out synchronization circuit 204 and the delay clock signal provided by the time-out synchronization circuit 204. The finite state machine additionally generates the signal to enable and disable the memory time-out circuit 206. The force skip input 240 forces the memory power controller to cause the next "N" clocks to be gated off in the gClk output. The intent is to be able to give the OTP memory time to turn back on in the event that it was shut off by something other than a change in clock speed.

Figure 3:
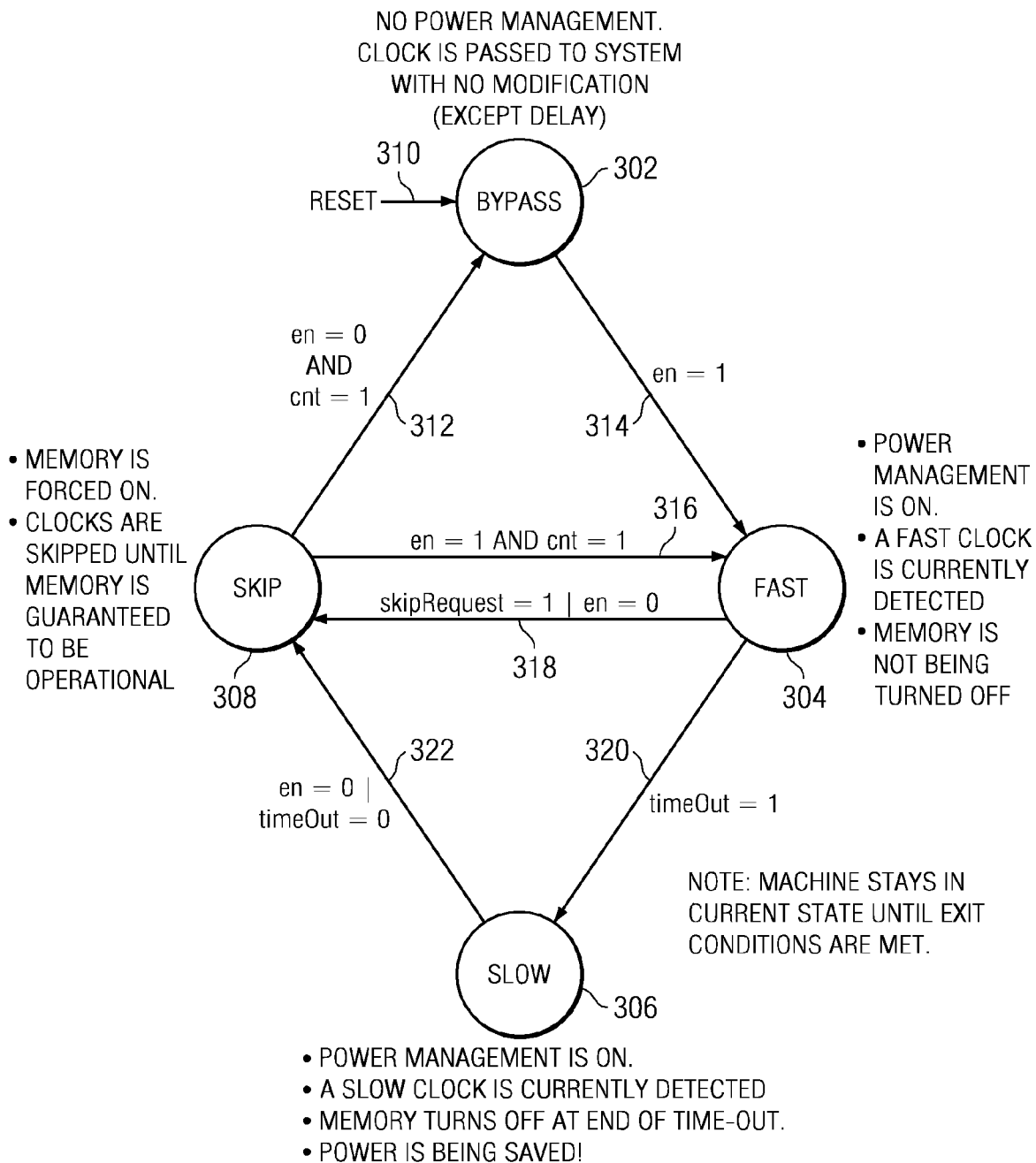
FIG. 3 is a state diagram describing the operation of the finite state machine of the memory power controller.

Referring now to FIG. 3, there is illustrated a state diagram for the finite state machine 202. The finite state machine 202 determines the characteristics of the incoming clock signal, controls the clock signal being applied to the remainder of the digital circuit via the gated clock signal output and enables and disables the OTP memory 104 responsive to the determined characteristics of the incoming clock signal. The state diagram includes a bypass state 302, a fast clock state 304, a slow clock state 306 and a skip state 308. When in the bypass state 302, the delay clock signal is provided as the gated clock signal output from the memory power controller 102. This state provides no power management, and the source clock signal is passed onto the associated digital circuitry with no modification other than the delay implemented by the time-out synchronization circuit 204.

The fast clock state 304 is the state wherein the fast clock signal generated by pulse generation circuit 210 is provided as the gated clock output of the memory power controller 102. In this state, power management is active, and a fast clock signal is currently being detected by the memory time-out circuit 206 responsive to the source clock being less than a predetermined period. The associated OTP memory 104 is not turned off by the finite state machine 202 in this state.

In the slow clock state 306, the slow clock signal 228 provided from the pulse generation circuit 208 is provided as the gated clock output of the memory power controller 102. Within the slow clock state, the memory power management is turned on and a slow clock signal is currently being detected by the memory timeout circuit 208 wherein the source clock is greater than a predetermined period (i.e., the time-out signal is high). Within the slow clock state, the associated OTP memory 104 is turned off at the end of a time-out period and power is thus saved by the circuit.

Within the skip state 308, the OTP memory 104 is forced on by the finite state machine 202 and each of the clock signals (slow clock, fast clock and delay clock) are skipped until the memory 104 is guaranteed to be operational. During this time period, no gated clock signal is provided from the memory power controller 102. This period occurs when passing from the slow state 306 to the fast state 304, when passing from the fast state 304 to the bypass state 302 or when there is a skip request [e.g., forceSkip is active].

The state machine 202 enters the bypass state responsive to an applied reset signal 310 or responsive to the enable signal of the memory power controller to the FSM 202 being a logical "0" and the CNT (count) signal equaling a logical "1" when the memory power controller 102 is within the skip state 308. The CNT signal indicates a sufficient number of clock cycles (i.e., 20) have occurred to enable switching states. When the finite state machine 202 is in the bypass state 302 and there is an indication that the enable signal equals a logical "1", the state machine passes at 314 from the bypass state 302 to the fast clock state 304. The state machine 202 may also enter the fast clock state 304 from the skip state 308 when the enable signal equals a logical "1" and the CNT signal equals a logical "1" as indicated generally at 316. From the fast clock state 304, the finite state machine 202 may cause the memory control circuit 102 to pass to either the slow clock state 306 or the skip state 308. The state machine 202 goes from the fast clock state 304 to the slow clock state 306 at 320 responsive to the time-out signal from the memory time-out circuit equaling a logical "1". This provides an indication that the received delay clock signal has a period that is great enough to start saving power, by turning off the memory. The state machine 202 may pass from the fast clock state to the skip state 308 at 318 responsive to the skip request signal equaling a logical "1" and the enable signal to the memory time-out controller equaling a logical "0".

The slow clock state 306 is only entered from the fast clock state 304 responsive to a time-out signal equal to a logical "1" at 320 as described previously. The slow clock state 306 only passes to the skip state 308. This occurs responsive to the enable signal being applied to the memory power controller at the FSM 202 equaling a logical "0" or the time-out signal from the memory time-out circuit 206 equaling a logical "0" indicating that the delay clock signal 220 is faster than the predetermined period of time as indicated at 322.

Once the finite state machine 202 enters the skip state 308 from either the slow clock state 306 or the fast clock state 304 in the manners described previously, the finite state machine 202 can switch to either the bypass state 302 responsive to the enable equaling a logical "0" and CNT equaling a logical "1" at 312 as described previously or, in response to the enable equaling a logical "1" and the CNT equaling a logical "1" at 316, switch to the fast state 304 as described previously.

Figure 4:
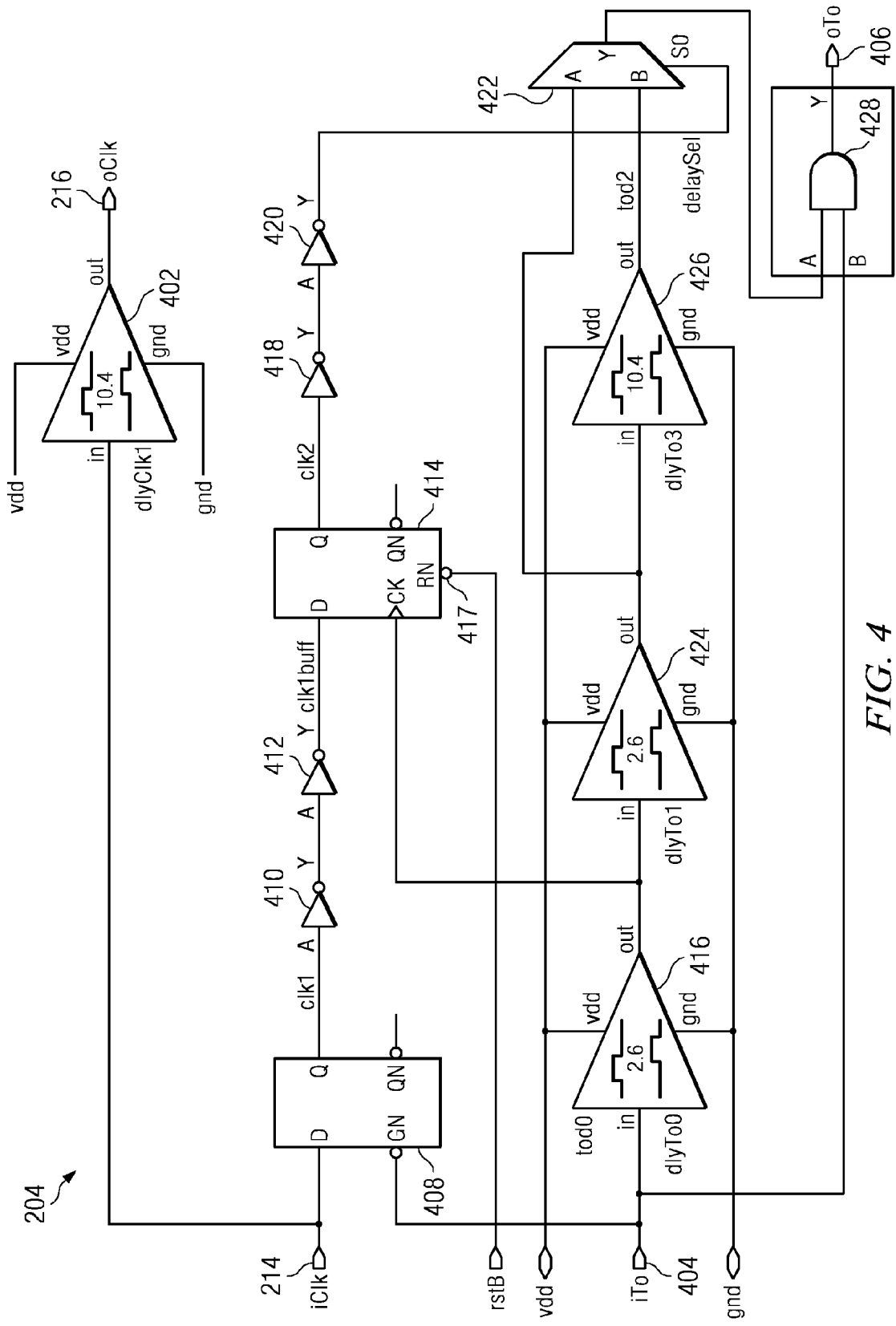
FIG. 4 is a schematic diagram of the time-out synchronization circuit.
Figure 5:
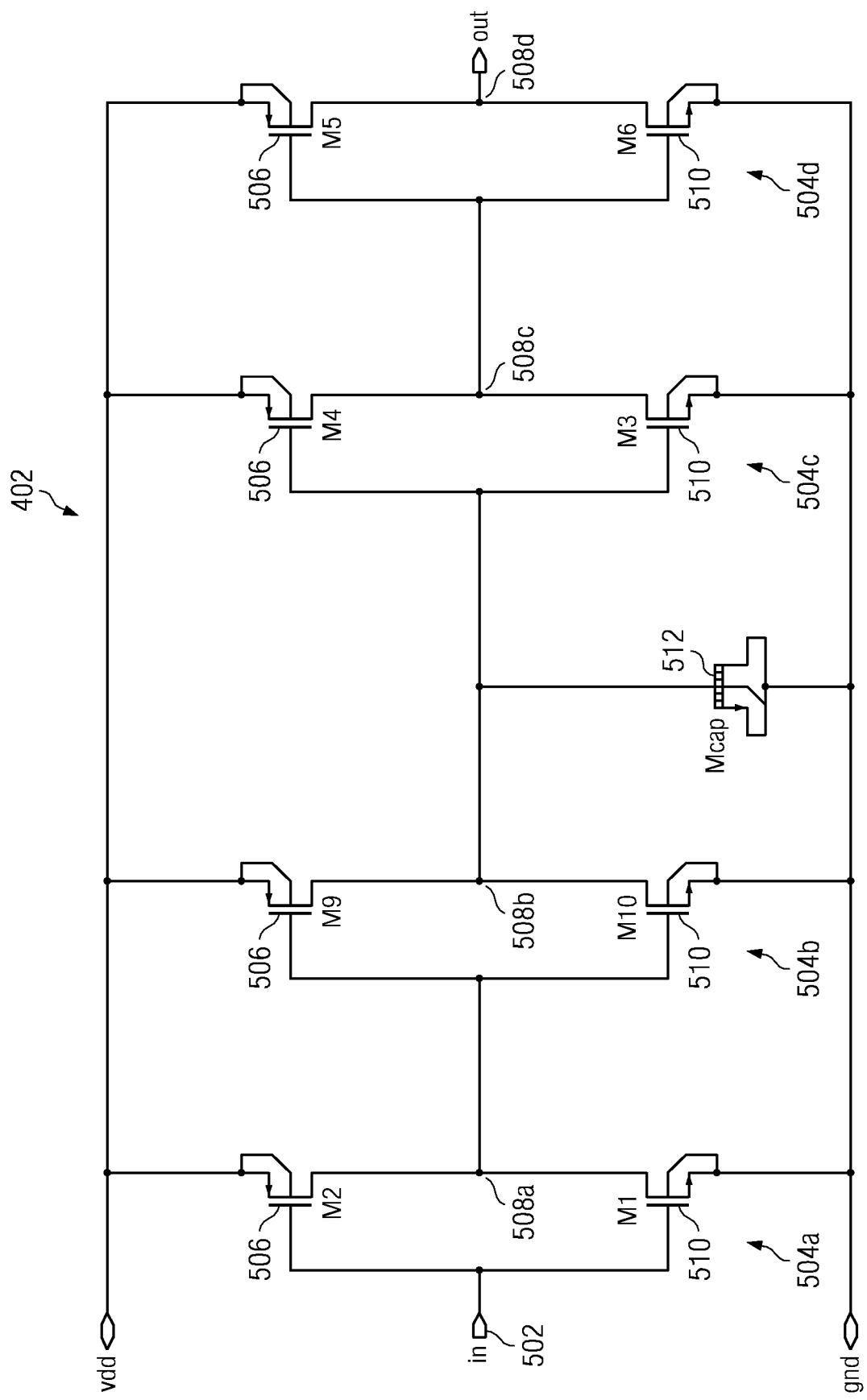
FIG. 5 is a schematic diagram of the delay circuit within the time-out synchronization circuit.

Referring now to FIG. 4, there is illustrated a schematic diagram of the time-out synchronization circuit 204. The source clock signal is applied to input ICLK 214 as described previously with respect to FIG. 2. The delayed clock signal is provided from the OCLK output 216. The source clock signal applied at input 214 is delayed by delay circuit 402. The delay circuit 402 delays the provided source clock signal by 10 nanoseconds in the preferred embodiment to provide the delay clock signal (DLYCLK). Other amounts of delay could also be used. Referring now also to FIG. 5, there is provided a schematic diagram of the delay circuit 416 or 424. The source clock signal is applied to the input 502 that is applied to a series connection of four inverters 504. Each inverter 504 includes a first transistor 506 having its source/drain path connected between $V_{DD}$ and node 508. A second transistor 510 has its drain/source path connected between node 508 and ground. Node 508 comprises the output node of the inverter 504. The input node of the inverter 504 is connected to the gate of each transistors 506 and 510. The group of inverters 504 are connected in series such that a first inverter 504a has its input connected to node 502 and its output connected to node 508a. The input of the second inverter 504b has its input connected to node 508a and its output connected to node 508b. The third inverter 504c has its input connected to node 508b and its output connected to node 508c. The fourth and final inverter 504d has its input connected to node 508c and its output connected to node 508d. The input inverter 504a is a minimum sized inverter driving a second minimum sized inverter 504b to present minimum loading. The lengths of the second inverter 504b are slightly larger than that of the lengths of inverter 504a to add delay to the circuit without increasing the footprint. A transistor 512 removes any threshold voltage dependence within the circuit. Transistor 512 is connected as a capacitor. This is the 'C' element of the RC delay. The gate of transistor 512 is connected to node 508b and the drain and source of transistor 512 are connected to ground.

Referring now back to FIG. 4, an additional input to the time-out synchronization circuit 204 comprises the time-out signal initially generated at the memory time-out circuit 206 and passed to the time-out synchronization circuit 204 via the pulse generation circuit 208. The time-out signal is provided to a time-out signal delay path at input 404. The synchronized time-out delay signal is provided from the output 406 to the finite state machine 202 and also comprises the OTP memory disable/enable signal. The source clock signal applied at input 214 is applied along a clock input path that initially includes a latch 408 having the source clock signal applied to the D input thereof. The rising edge of the time-out, iTo, is used to capture the current level of the source clock, iClk to enable selection of the delay applied to the synchronized time-out signal oTo. The GN input of latch 408 is connected to receive an inverted time-out signal via input 404. The source clock signal 214 is captured by the latch 408. The Q output of latch 408 is connected to the input of inverter 410. The output of inverter 410 is connected to the input of a second inverter 412. The output of inverter 412 is connected to the D input of a flip-flop 414. The clock input of flip-flop 414 is connected to the output of a delay circuit 416 having a configuration similar to that described with respect to the delay circuit of FIG. 5. The input of the delay circuit 416 is connected to the time-out signal applied via input 404. A reset signal may be applied to the reset input 417 of flip-flop 414. The Q output of flip-flop 414 is applied to the input of an inverter 418. The output of inverter 418 is applied to the input of inverter 420. The output of inverter 420 is applied as a delay select signal to a multiplexer 422. The delay select signal enables the inverter 420 to select one of two delayed time-out signals that have gone through a series of delay circuits that is provided as the synchronized time-out signal. The delay select signal is based upon the captured clock signal via latch 408 and flip-flop 414.

The output of delay circuit 416, in addition to being applied as a clock signal to latch 414, is applied to the input of a second delay circuit 424. The output of delay circuit 424 is applied as one input to the multiplexer 422 and is also applied to the input of a third delay circuit 426. These delay circuits are configured as discussed in FIG. 5. The output of the delay circuit 426 comprises the second input of the multiplexer 422. The output of the multiplexer 422 is applied to a first input of AND gate 428. The multiplexer 422 provides the time-out signal with the selected delay responsive to the captured clock signal. The second input of AND gate 428 is connected to receive the time-out signal via node 404. The output of the AND gate 428 comprises a time-out signal that has a rising edge that is synchronized with the rising edge of the output clock at node 406. The 'oTo' signal is a delayed version of the time-out that is synchronized with the output/delay clock. However, only the rising edge of the 'oTo' needs to be synchronized. When the 'iTo' signal is cleared, the 'oTo' signal needs to be clear as soon as possible. Gate 428 ensures a fast clearing, with a synchronized setting. Each of the delay circuits 402 and 426 are made of 4 delay cells as described in FIG. 5, while 416 and 424 each use only 2 delay cells.

Figure 6:
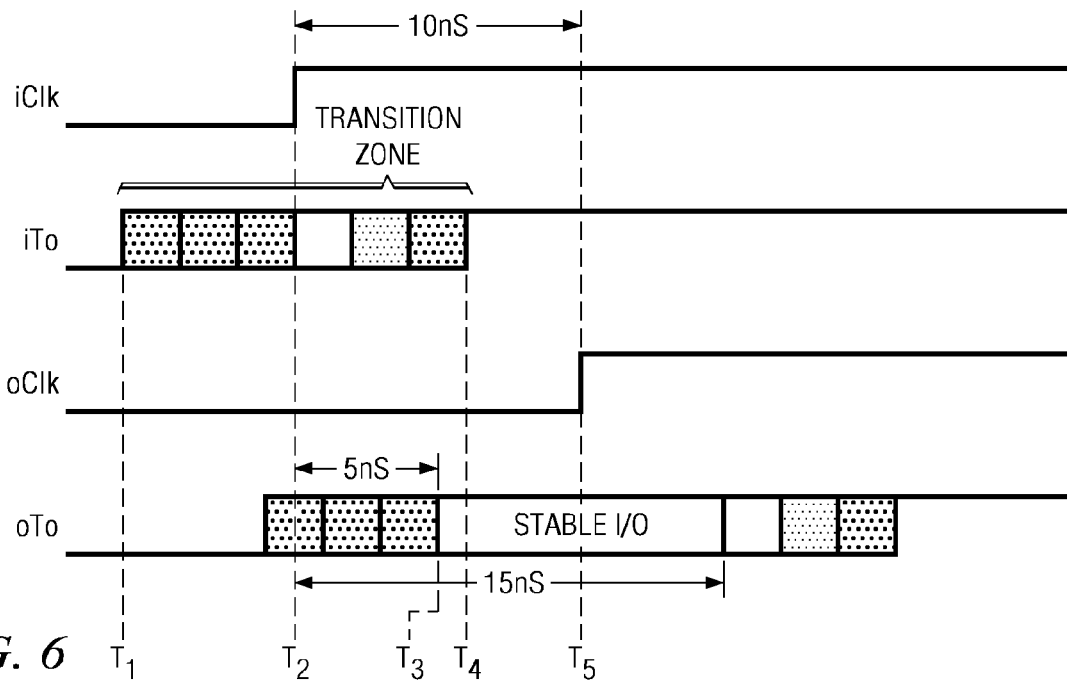
FIG. 6 illustrates the manner in which the time-out signal is synchronized with the received source clock.

Referring now to FIG. 6, there are illustrated timing diagrams describing the manner in which the delay clock signal and the synchronized time-out signal are generated by the time-out synchronization circuit 204. The purpose of the time-out synchronization circuit 204 is to enable the time-out signal to act asynchronously, while avoiding the case where the rising edge of the time-out signal is too close to the rising edge of the source clock signal. This is enabled by shifting the time-out signal to approximately 5 nanoseconds from the rising edge of the delayed source clock signal by selecting the appropriate amount of delay within the time-out synchronization circuit. When the source clock signal applied to the ICLK input goes high at time $T_2$, two functions are performed by the time-out synchronization circuit 204. The delay circuit 402 will delay the source clock signal by approximately 10 nanoseconds such that at time $T_5$, the rising edge of the delayed clock signal is provided. If the time-out signal iTo occurs at any time within the transition zone between time $T_1$ and $T_4$ this would potentially cause problems because the rising edge of the $T_{out}$ time-out signal is too close to the rising edge of the source clock signal. Thus, based upon the source clock signal applied at input 214 of the time-out synchronization circuit 204 and the time-out signal applied at input 404 of the time-out synchronization circuit 204 the actual rising clock edge of the source clock signal is determined by the clock input path circuit and used to select an appropriate delay at multiplexer 422 such that the synchronized time-out signal OTO has its rising edge no closer than approximately 5 nanoseconds from the rising edge of the output clock oClk (the delayed source clock). Illustrated in Fig. 6 is an example of the rising edge of the input time-out, iTo, happening too close to the rising edge of the input clock, iClk. Without the synchronization, this case could introduce operational errors in the FSM, caused by races, and meta stable outputs. In order to eliminate the risk, a data dependant delay is introduced in the time-out path. This ensures that the rising edge of the output time-out, oTo, does not happen too close to the output clock, oClk. This is accomplished by sampling the input clock, iClk, using the rising edge of the input time-out, iTo. When the iTo transition takes place before time T2, a minimal delay is added to the time-out path. When the iTo transition takes place after time T2, a maximum delay is added to the time-out path. The result is that there can be no rising transition on the oTo around the time of the rising transition of oClk.

Figure 7:
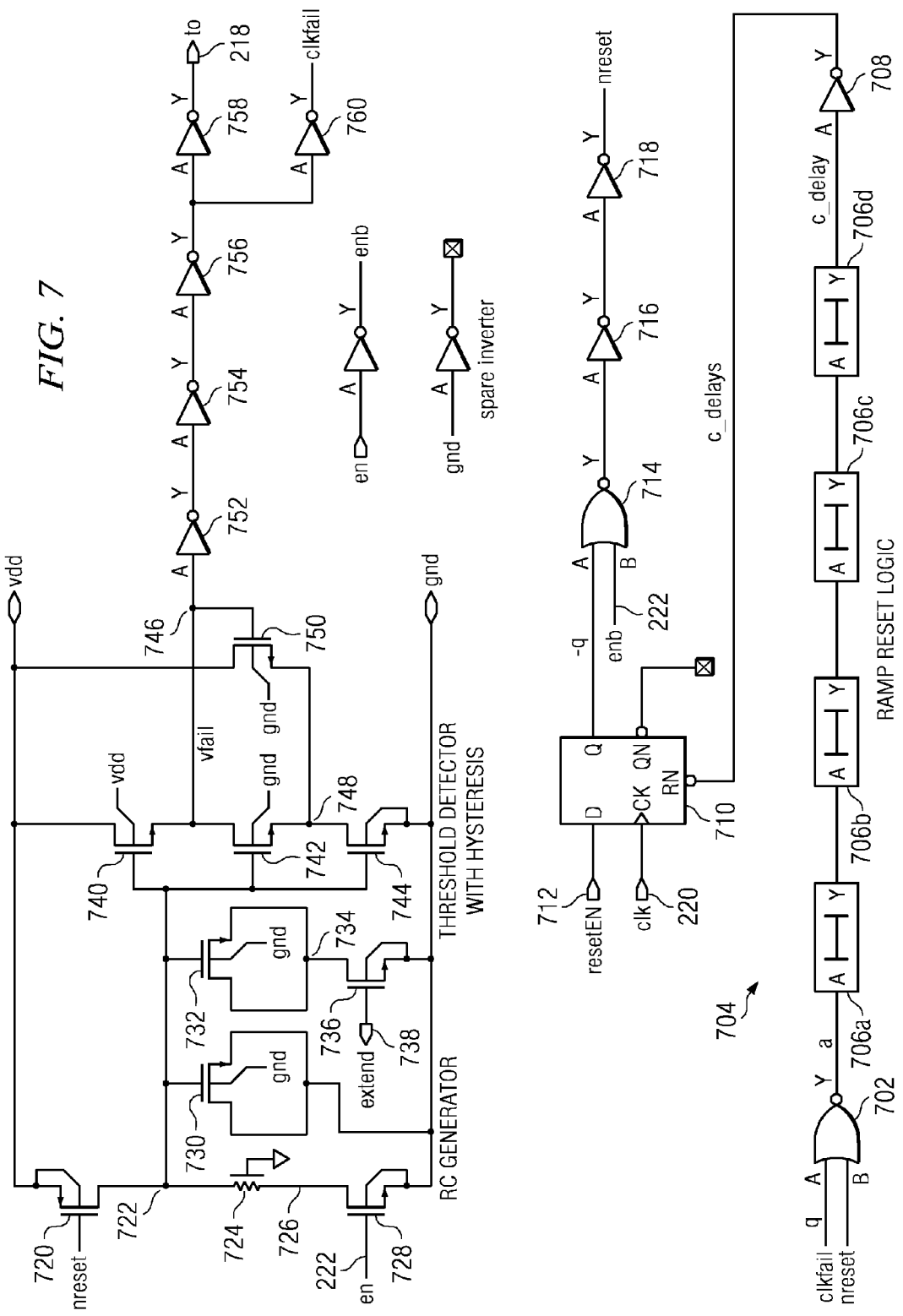
FIG. 7 is a schematic diagram of the memory time-out circuit.

Referring now to FIG. 7, there is provided a schematic diagram of the memory time-out circuit 206. Applied to the first and second inputs of a NOR gate 702 are the CLKFAIL signal and the NRESET signal. The output of the NOR gate 702 is connected to ramp reset logic 704 consisting of a series connection of four delay cells 706. The delay cells 706 consist of a string of CMOS inverters. The input of an inverter 708 is connected to the Y output of delay cell 706b. The output of inverter 708 is connected to the enable pin of flip-flop 710. The flip-flop 710 receives the reset En signal at node 712 connected to the D input of flip-flop 710. The delayed clock signal is applied to the clock input of flip-flop 710 at node 720. The Q output of flip-flop 710 is connected to a first input of NOR gate 714. The second input of NOR gate 714 is connected to the enable signal at node 222. The output of NOR gate 714 is connected to the input of a first inverter 716, and the output of inverter 716 is connected to the input of a next inverter 718. The output of inverter 718 provides the N reset signal which is applied to one input of NOR gate 702 and is also applied to the gate of a transistor 720.

Transistor 720 has its source/drain path connected between $V_{DD}$ and node 722. A resistor 724 is connected between node 722 and node 726. A transistor 728 has its drain/source path connected between node 726 and ground. The gate of transistor 728 is connected to the enable signal at node 222 of the memory time-out circuit 206. A pair of native transistors 730 each have their gates connected to node 722 and are used to remove threshold voltage dependence. Transistor 730 has its gate connected to node 722 and its drain/source connected to ground. Transistor 732 also has its gate connected to node 722 and its drain/source connected to node 734. A transistor 736 has its drain/source path connected between node 734 and ground. The gate of transistor 736 is connected to receive the "extend" signal at node 738 from the state machine 202. The extend signal adds hysteresis to the slow/fast clock detector consisting of transistors 740-744.

Transistors 740, 742 and 744 are connected in series between $V_{DD}$ and ground. Each of these transistors has their gates connected to node 722. Transistor 740 has its source/drain path connected between $V_{DD}$ and node 746. Transistor 742 has its drain/source path connected between node 746 and node 748. Transistor 744 has its drain/source path connected between node 748 and ground. A transistor 750 has its gate connected to node 746 and its drain/source path connected between $V_{DD}$ and node 748. These transistors all comprise high voltage transistors and are used as a threshold detector with hysteresis. These transistors assist in measuring the period of the clock signal to determine if it exceeds the predetermined threshold. The reset signal resets the threshold detector after each clock period measurement. Node 746 is connected to the input of a first inverter 752. The output of inverter 752 is connected to the input of inverter 754. The output of inverter 754 is connected to the input of inverter 756, and the output of inverter 756 is connected to the input of an inverter 758 and an inverter 760. The output of inverter 758 comprises the time-out signal which is provided at node 218. The output of inverter 760 provides a clock CLKFAIL signal which is applied to the input of NOR gate 702.

The memory time-out circuit 206 compares the delay clock signal applied at input 220 to a predetermined period of time, to determine whether the time-out signal goes high. The time-out is cleared on every input +edge. Only the +edge is determined by the input clock period. When the time-out signal goes high, logical "1" this is an indication that the slow clock signal should be provided as the gated clock signal of the memory power controller 102. When the time-out signal is logical "0" this is an indication that the fast clock signal should be used as the gated clock signal of the memory power controller 102. The length of the time-out defines the switch-over point for fast v. slow clock operation. There is a cost associated with switching from slow to fast clock mode. This cost is the skipped clock cycles. Due to clock noise, if the system clock period were close to the time-out value (switch-over point), the system would randomly switch between slow and fast clock mode. (A very inefficient mode of operation.) To prevent this, the time-out period is altered based on the mode. When entering a slow clock mode (i.e., a long clock period), the time-out period is shortened. This results in the switch-over point being moved to a higher frequency. Additionally, when we enter fast clock mode, the time-out period is increased. This hysteresis ensures that the clock frequency and the switch-over point for an extended period.

Figure 8:
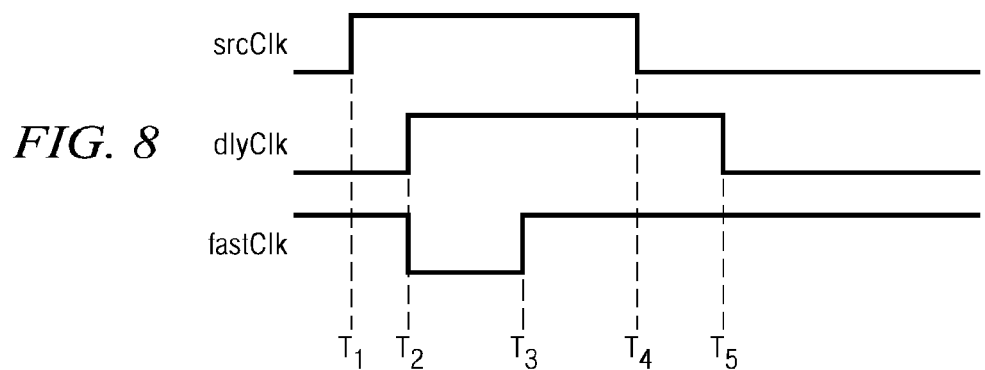
FIG. 8 is a timing diagram illustrating the generation of the fast clock signal.

Referring now to FIG. 8, there is illustrated the manner for generating the fast clock signal by the pulse generation circuit 210 of the memory power controller 102. The source clock signal provided at the input of the memory power controller signal goes high at time $T_1$ and goes low at time $T_4$. At a predetermined delay after the source clock goes high, the delay clock goes high at time $T_2$. The delay clock goes low at time $T_5$ at the same delay after the source clock goes low at time $T_4$. Substantially upon the rising edge of the delay clock signal at time $T_2$, a low pulse is generated by the pulse generation circuit 210 from time $T_2$ to time $T_3$. In the preferred embodiment, the pulse width between time $T_2$ and $T_3$ is 20 nanoseconds. Once entering the fast clock state at time $T_2$ the 20 nanosecond low pulse from the pulse generator 210 comprising the fast clock signal is generated.

Figure 9:
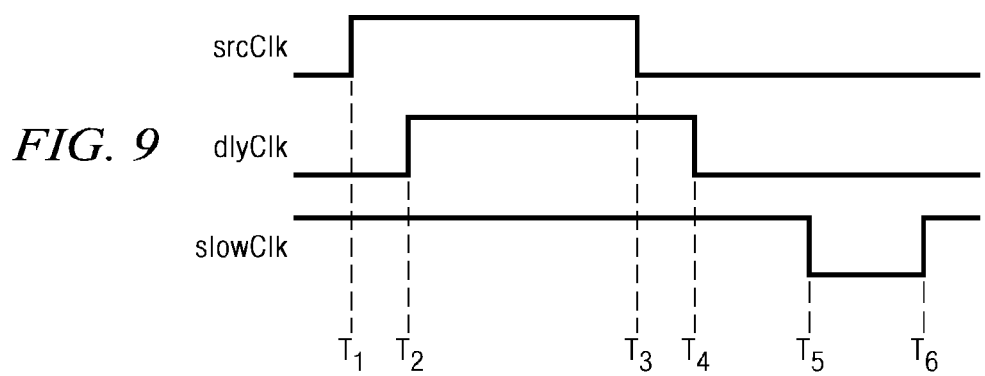
FIG. 9 is a timing diagram illustrating the generation of the slow clock signal.

Referring now to FIG. 9, there is illustrated the manner in which the slow clock signal is generated by the pulse generator 208 responsive to a determination that the time-out signal provided from the memory time-out circuit 206 has gone high. In this case, the source clock signal applied to the input of the memory power controller 102 goes high at time $T_1$. The delayed clock signal is generated beginning at time $T_2$ when the delay clock pulse goes high after the predetermined delay from the source clock. When the source clock signal goes low at time $T_3$, the delay clock signal correspondingly goes low after the predetermined delay from the source clock at time $T_4$. The slow clock signal pulse is generated as a low pulse from time $T_5$ to time $T_6$. In the preferred embodiment, the period of the low pulse between times $T_5$ and $T_6$ is 20 nanoseconds. The slow clock pulse goes low at time $T_5$ a predetermined distance from the rising clock edge of the source clock at time $T_1$. In a preferred embodiment, the period of time from $T_1$ to $T_5$ is 310 nanoseconds. More specifically, this is the sum of the clock delay plus the turn-on time of the memory.

Figure 10:
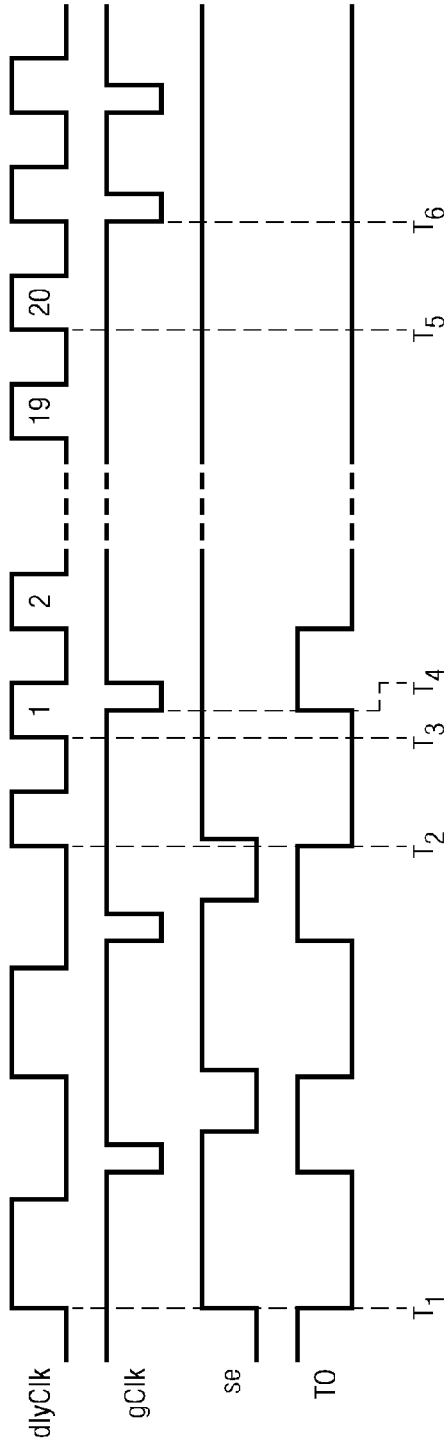
FIG. 10 is a timing diagram illustrating the switching of the gated clock signal from the slow clock signal to the fast clock signal.

Referring now to FIG. 10, there is illustrated a timing diagram of the process of the gated clock of the memory power controller 102 going from the slow clock state to the fast clock state. From time $T_1$ to time $T_4$, the memory power controller is in the slow clock state and providing the slow clock signal as the gated clock output of the controller 102. Responsive to occurrence of a delay clock pulse at time $T_3$, the memory power controller 102 is no longer in the slow clock state but enters the skip state after time $T_4$ to time $T_6$. The memory power controller 102 is in the fast clock state after time $T_6$. The gated clock signal goes low for a 20 nanosecond pulse one further time at time $T_4$ responsive to the last apparent slow clock pulse at time $T_2$. The state machine then determines the predetermined time period from time $T_3$ to time $T_5$. This time period from $T_3$ to $T_5$ is to ensure that the OTP memory 104 has had sufficient time to power on responsive to the OTP memory enable signal (SE) going high substantially at time $T_2$. Once the SE signal goes high within the skip state, the SE signal remains high through the remainder of the skip state and into the fast clock state beginning at $T_6$.

Figure 11:
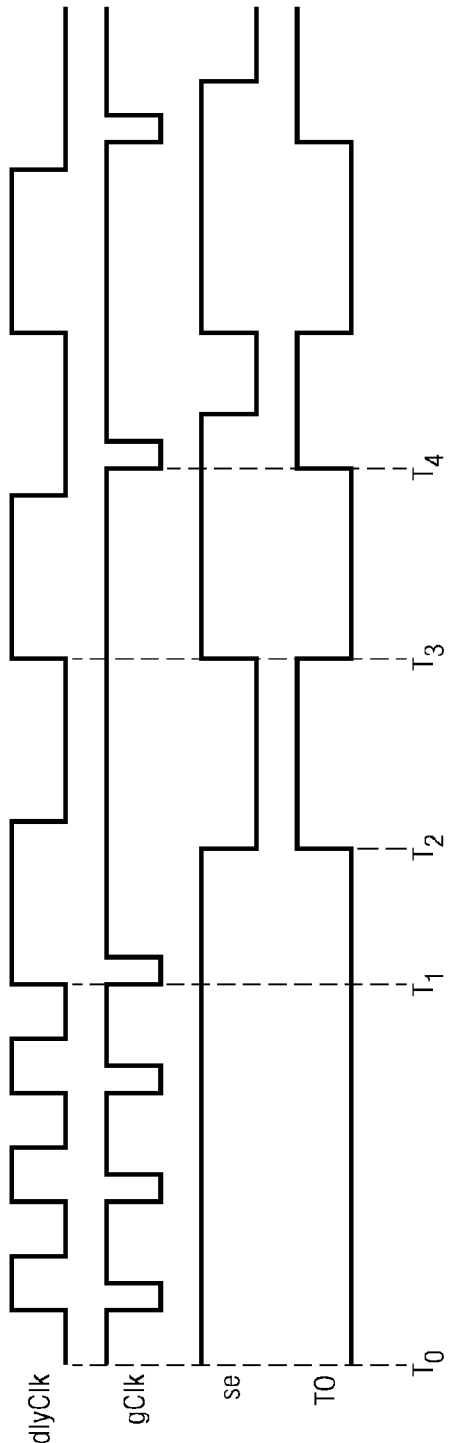
FIG. 11 is a timing diagram illustrating the switching of the gated clock signal from the fast clock signal to the slow clock signal.

Referring now to FIG. 11, there is illustrated the process wherein the gated clock is switched from a fast clock signal from times $T_0$ to times $T_3$ to the slow clock signal after time $T_3$. After time $T_1$ when a fast clock signal is no longer being provided as the delay clock, the time-out signal goes high at time $T_2$ responsive to the delay clock period exceeding the predetermined length. Responsive to the next rising clock edge at time $T_3$, the slow clock pulse is provided as the gated clock signal at time $T_4$. Once the time-out signal goes high at time $T_2$ responsive to the memory time-out circuit detecting the slowing of the delay clock, the memory will be disabled substantially at time $T_2$ by the SE signal going low.

Using the herein described memory power controller, power can be saved within an associated digital circuit by using a combination of differing clock signals and control of on and off times of an associated memory. The fast or slow clock signals are provided responsive to the corresponding speed of the source clock being provided to the digital circuit. The associated memory is turned on and off responsive to detection of the slow and fast clock signals and signals are appropriately delayed to compensate for the turn on times for the memory.

It will be appreciated by those skilled in the art having the benefit of this disclosure that this memory power controller provides an improved manner for power control of an OTP memory. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:
1. A memory power controller comprising:
    clock generation circuitry for generating a first clock signal and a second clock signal responsive to a source clock and a determination that the source clock has a period greater than a predetermined value, wherein the first clock is generated responsive to the determination that the source clock has the period greater than the predetermined value and the second clock is generated responsive to the determination that the source clock has a period less than the predetermined value; and memory timeout circuitry for generating a memory enable/disable signal to control operation of an associated memory responsive to the source clock and a determination that the source clock has the period greater than the predetermined value, wherein the memory timeout circuitry further synchronizes the memory enable/disable signal with respect to a delayed version of the source clock.

2. The memory power controller of claim 1, wherein the predetermined value comprises a predetermined period of time.

3. The memory power controller of claim 1, wherein the predetermined value comprises a predetermined number of clock pulses.

4. The memory power controller of claim 1, wherein the first clock signal is substantially slower than the second clock signal.

5. The memory power controller of claim 1, wherein the memory timeout circuitry synchronizes the memory enable/disable signal with the source clock by generating the memory enable/disable signal to occur a predetermined time period with respect to the delayed clock source.

6. The memory power controller of claim 1, wherein the clock generation circuitry generates a third clock signal responsive to an external control signal, the third clock signal comprising a delayed version of the source clock.

7. The memory power controller of claim 1, wherein the clock generation circuitry further comprises:
first pulse generation circuitry for generating the first clock signal responsive to an indication that the source clock has the period greater than the predetermined value;
second pulse generation circuitry for generating the second clock signal responsive to a delayed source clock;
a multiplexer having inputs connected to receive the first clock signal and the second clock signal, wherein the multiplexer selects the first clock signal or the second clock signal responsive to a control input; and
a state machine for generating the control input responsive to the delayed source clock and the memory enable/disable signal.

8. The memory power controller of claim 7, wherein the memory timeout circuitry further comprises:
a clock period measurement circuit for determining when a period of the delayed source clock exceeds a predetermined period and generating the indication that the source clock has the period greater than the predetermined period; and
clock synchronization circuitry for generating the memory enable/disable signal to occur a predetermined time after a clock edge of the source clock responsive to the indication that the source clock has the period greater than the predetermined period.

9. The memory power controller memory power controller of claim 8, wherein the clock synchronization circuitry receives the source clock and generates the delayed source clock.

10. The memory power controller of claim 7, wherein the state machine generates the control input to select the first clock signal when the period of the delayed source clock is greater than the predetermined value and further wherein the state machine generates the control input to select the second clock signal when the period of the delayed source clock is less than the predetermined value.

11. A memory power controller, comprising:
clock synchronization circuitry connected to receive a source clock and a memory time out signal for generating a delayed clock source responsive to the received clock source and for generating a memory enable/disable signal to control operation of an associated memory, the memory enable/disable signal comprising the memory timeout signal synchronized to occur at a predetermined time period with respect to the delayed clock source, the synchronization moves an active edge of the timeout signal away from an active edge of the delay clock source;
a clock period measurement circuit for determining when a period of the delayed source clock exceeds a predetermined period and generating the memory time out signal indicating that the delayed source clock has a period greater than the predetermined period;
first pulse generation circuitry for generating a first clock signal responsive to the memory time out signal indicating that memory has been turned on long enough to use;
second pulse generation circuitry for generating a second clock signal responsive to the delayed source clock;
a multiplexer having inputs connected to receive the first clock signal and the second clock signal, wherein the multiplexer selects the first clock signal or the second clock signal responsive to a control input; and
a state machine for generating the control input responsive to the delayed source clock and memory enable/disable signal, wherein the state machine generates the control input to select the first clock signal when the period of the delayed source clock is greater than the predetermined value and further wherein the state machine generates the control input to select the second clock signal when the period of the delayed source clock is less than the predetermined value.

12. The memory power controller of claim 11, wherein the predetermined value comprises a predetermined period of time.

13. The memory power controller of claim 11, wherein the predetermined value comprises a predetermined number of clock pulses.

14. The memory power controller of claim 11, wherein the first clock signal is substantially slower than the second clock signal.

15. The memory power controller of claim 11, wherein the multiplexer is further connected to receive the delayed source clock.

16. The memory power controller of claim 15, wherein the state machine generates the control input to cause the multiplexer to select the delayed clock source responsive to an external control signal.

17. A method for providing power control to a memory comprising the steps of:
determining if a source clock has a period greater than or less than a predetermined value;
generating each of a first clock signal and a second clock signal responsive to at least one of a source clock and the determination that the source clock has a period greater than a predetermined value;
selecting the first clock signal responsive to the determination that the source clock has a period greater than the predetermined value;
selecting the second clock responsive to the determination that the source clock has a period less than the predetermined value;
generating a memory enable/disable signal to control operation of an associated memory responsive to the source clock and the determination that the source clock has a period greater than the predetermined value; and synchronizing the memory enable/disable signal to occur a predetermined period with respect to a delayed version of the source clock.

18. The method of claim 17, wherein the predetermined value comprises a predetermined clock period.

19. The method of claim 17, wherein the predetermined value comprises a predetermined time.

20. The method of claim 17, wherein the first clock signal is substantially slower than the second clock signal.

21. The method of claim 17 further comprising the steps of:
generating a third clock, the third clock signal comprising the delayed version of the source clock; and
selecting the third clock responsive to an external control signal.

22. The method of claim 17, wherein the step of generating further comprises the steps of:
generating the first clock signal responsive to an indication that the source clock has a period greater than the predetermined value;
generating the second clock signal responsive to a delayed source clock.

23. The method of claim 17, wherein the steps of selecting further comprises the steps of:
selecting the first clock signal responsive to a control signal indicating the determination that the source clock has a period greater than the predetermined value; and
selecting the second clock responsive to a control signal indicating the determination that the source clock has a period less than the predetermined value.

* * * * *